United States Patent [19]

Okumura et al.

[11] 4,113,533
[45] Sep. 12, 1978

[54] METHOD OF MAKING A MOS DEVICE

[75] Inventors: Tomisaburo Okumura, Kyoto; Hiroshi Okazaki, Takatsuki; Akira Tsuchitani, Joyo; Seiji Ueda, Takatsuki, all of Japan

[73] Assignee: Matsushita Electronics Corporation, Kadoma, Japan

[21] Appl. No.: 763,679

[22] Filed: Jan. 28, 1977

[30] Foreign Application Priority Data

Jan. 30, 1976 [JP] Japan .................. 51-9871

[51] Int. Cl.$^2$ ........................... H01L 29/78
[52] U.S. Cl. ......................... 148/187; 357/23
[58] Field of Search ........................ 148/187; 357/23

[56] References Cited

U.S. PATENT DOCUMENTS

| 3,615,873 | 10/1971 | Sluss, Jr. | 148/1.5 |
|---|---|---|---|
| 3,852,104 | 12/1974 | Kooi | 117/212 |
| 3,906,620 | 9/1975 | Anzai et al. | 29/571 |
| 3,936,859 | 2/1976 | Dingwall | 357/23 |
| 3,943,542 | 3/1976 | Ho et al. | 357/23 |
| 3,958,323 | 5/1976 | De La Moneda | 29/571 |
| 4,035,198 | 7/1977 | Dennard et al. | 148/1.5 |

OTHER PUBLICATIONS

Appels et al., "Local Oxidation of Si — Device Technology", Phillips Res. Repts. 25 (1970), 118.
D. M. Brown et al., "Refractory Metal Si Device Technology", Solid State Electr. 11 (1968) 1105.
Vadasz et al., "Silicon Gate Technology", IEEE Spectrum, Oct. 1969, p. 28.

Primary Examiner—R. Dean
Assistant Examiner—Upendra Roy
Attorney, Agent, or Firm—Cushman, Darby & Cushman

[57] ABSTRACT

A method of making a MOS device, for instance, metal-oxide semiconductor type integrated circuit, is disclosed which comprises the following steps:

Sequentially forming on a specified part of single crystal silicon substrate,
 firstly, an oxide film,
 secondly, a film to become a conductor film having a high-temperature-resistive nature, which does not melt at an impurity-diffusion temperature, serves as a diffusion mask and later serves as a gate electrode, for instance, polycrystalline silicon film; and
 thirdly, an oxidation-preventing film for preventing oxidation of said film to become the conductor film, wherein at least said conductor film and said overiding oxidation-preventing film have the same pattern so as to cover and prevent oxidation of said conductor film by said oxidation-preventing film, and then
diffusing an impurity into the substrate from openings which are the parts other than those covered by said conductor film and said oxidation preventing film,
the method being characterized by having a step of thermally oxidizing side-end parts of the oxide film underneath said film to become the conductor film and also the surface of said silicon substrate.

According to the abovementioned method, the undesirable side-etched concave part of oxide film under a gate conductor film hitherto inevitable is not formed thereby improving the drain-breakdown voltage characteristic, lowering the gate leakage current and eliminating the possibility of open circuits of vapor-deposited metal films for wiring.

9 Claims, 7 Drawing Figures

4,113,533

METHOD OF MAKING A MOS DEVICE

BACKGROUND OF THE INVENTION

This invention relates to a method of making a self-alignment type metal oxide semiconductor (hereinafter called MOS) device, wherein side-end parts of the oxide film underneath a metal film or a gate conductor film and the surface of source and drain region of a silicon substrate are thermally oxidized in order to improve characteristic of the device.

Conventional methods of making method of the self-alignment type MOS device are elucidated referring to FIGS. 1 and 2.

In FIG. 1, which shows sectional side view of a self-alignment type MOS FET, on a substrate 1 of a single crystal silicon, are sequentially formed thick films of thermally oxidized $SiO_2$ 2 for preventing parasitic MOS effect, a gate insulation film 3 of thin $SiO_2$ film formed by thermal oxidation, a polycrystalline film 4 to become a gate conductor film when impurity is diffused therein and a CVD-deposited insulation film 8 covering the principal surfaces of the substrate and also the side end parts of the gate insulation film 3. In the substrate are formed impurity-diffused source and drain regions 6 & 7.

The method of making the conventional MOS device of FIG. 1 is as follows: The gate insulation film 3 of a thin $SiO_2$ film is formed all the way on the substrate 1 of one conductivity and having the thick films 2 at specified parts, and the film 4 to become the gate conductor film of polycrystalline silicon film is formed all the way on the gate insulation film 3. Then the polycrystalline silicon film 4 is etched to have a specified pattern of the gate and connection wirings by utilizing a known photoresist film method. Subsequently, the gate insulation film 3 is etched by utilizing the previously etched polycrystalline silicon film 4 as an etching mask, so as to make openings through which the impurity is diffused to form source and drain regions 6 and 7. The etching is sufficiently carried out in order to completely remove the gate insulation film 3 at the openings. As a consequence of such sufficient etching, the side-end parts of the gate insulation film 3 underneath the polycrystalline silicon film 4 are side-etched thereby making the end parts of the polycrystalline silicon film 4 into a concave shape having hollow parts 5 thereunder. In the conventional MOS device, such hollow parts 5 remain unfilled even after chemical vapor deposition of the $SiO_2$ film 8 to cover the gate conductor film 4 therewith. Even in case the CVD film 8 is filled in the hollow parts 5, the CVD films 8 in the hollow become porous and of low density which are liable to be contaminated and cause poor electric characteristics, namely of low drain or source reverse breakdown voltages through the gate. When the side-etching underneath the concave shaped gate conductor 4 becomes large, the concave shaped end part 9 of the gate conductor 4 tends to fall down thereby forming cracks thereon, and as a result increasing gate leakage current and deteriorating electric characteristic of the MOS device. As a further consequence of said side-etching, steep steps 81 are formed on the surface of the CVD film 8 near the hollow parts 5, thereby resulting in forming very thin parts in the aluminum wiring film at the steep steps 81. Moreover, the steep steps 81 cause the etchant to retain the excessively etches there which causes a circuit opening of the Al wiring film at the steps.

SUMMARY OF THE INVENTION

This invention purports to eliminate the abovementioned shortcomings by forming a thermally oxidized $SiO_2$ film on and under the side-end parts of the gate insulation film so as to fill the hollow part under the end part of the gate conductor film with a sufficiently dense $SiO_2$ film and to make concave shaped side-end parts of the gate conductor film round.

DETAILED DESCRIPTION OF THE PRESENT INVENTION

Figure 3A:
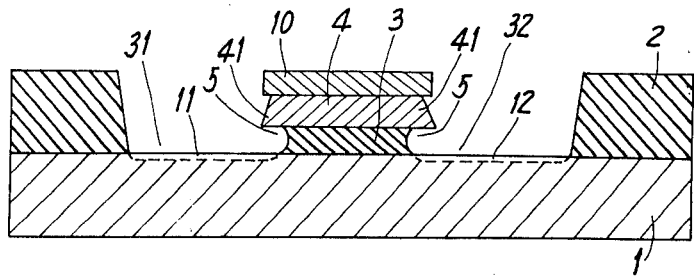

As shown in FIG. 3(a), on the substrate of single crystal silicon 1, the thick films 2 of $SiO_2$ of 0.1μm to 1.5μm thickness for prevention of parasitic MOS effect are formed on specified parts to encircle a unit of the MOS device, for instance, an FET, by heating the substrate 1 in an oxidizing atmosphere followed by selective etching through a photoresist mask. Then a gate insulation film 3 of thin $SiO_2$ film of 0.1μm to 0.15μm is formed by a thermal oxidation method, and a film 4 to become gate conductor film, for instance, polycrystalline silicon film of 0.2μm to 0.6μm is subsequently formed by vapor phase growth at 600° C to 900° C over the entire surface of the substrate 1 having thick films 2 having a specified pattern. Then, over the entire surface of the substrate, an antioxidation film 10 having a silicon nitride ($Si_3N_4$) of 0.08μm to 0.2μm thickness is formed by known chemical vapor deposition at 800° to 1000° C. Next, the anti-oxidation film 10 is selectively etched with a specified photoresist mask of a gate pattern and with known plasma etching by Freon gas. After the etching, the photoresist film is removed, and then, by utilizing the remaining $Si_3N_4$ film of the gate pattern as a mask, the polycrystalline silicon film 4 is etched by a known etchant consisting of a mixture of nitric aid and fluoric acid and subsequently the gate insulation film 3 is etched by another well known etchant consisting of a mixture of ammonium fluoride and fluoric acid to the degree of an excessive etching, that is until the side end parts of the gate insulation film 3 underneath the gate conductor film 4 are side etched to form concave parts 5,5 as shown in FIG. 3(a). Then impurities 11, 12 for forming source and drain regions, for instance boron decomposed from $B_2H_6$, are deposited on the surface of the source and drain parts of the substrate 1 exposed from the etched openings 31 and 32. Any excessive amounts of the impurity remaining on the surface of the substrate 1 are removed by etching firstly by a solution of fluoric acid and subsequently by a solution of nitric acid, respectively, and the substrate is washed away by deionized water.

Figure 3B:
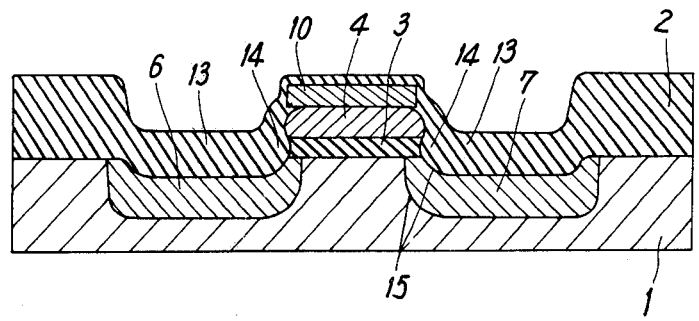

Then, the wafer is treated in a wet oxygen atmosphere at 1000° C to 1100° C, thereby chaning the concave shaped side end parts of the polycrystalline silicon film 4 into dense silicon oxide film 14. At the same time, the atoms of the impurity source diffuse into the substrate, thereby forming the source region 6 and the drain region 7, and furthermore, the surfaces of the source region 6 and the drain region 7 are also thermally oxidized to form dense silicon oxide film 13 in a manner to be continuous with said dense silicon oxide film 14 on the side ends of the gate insulation film 3. Since the oxidizing speed of the $Si_3N_4$ is very low, the silicon oxide film formed on the $Si_3N_4$ film 10 is very thin. Thus, as shown in FIG. 3(b), the concave parts 5,5 are completely eliminated, and dense silicon oxide films 14 are formed by the thermal oxidation of the end parts of said polycrystalline silicon film 4 and the surfaces of the source region 6 and drain region 7. The $SiO_2$ films 14 formed by thermal oxidation of the side end parts of the polycrystalline gate film 4 are dense and strong in comparison with conventional porous CVD film in the hollow parts under the gate conductor film, and accordingly the $SiO_2$ films 14 function to improve gate breakdown voltage. Furthermore, since the side end parts of the gate conductor film 4 are made round by the above-mentioned thermal oxidation, the concentration of electric force line is moderate at the side-end parts of the gate conductor film 4.

Figure 3C:
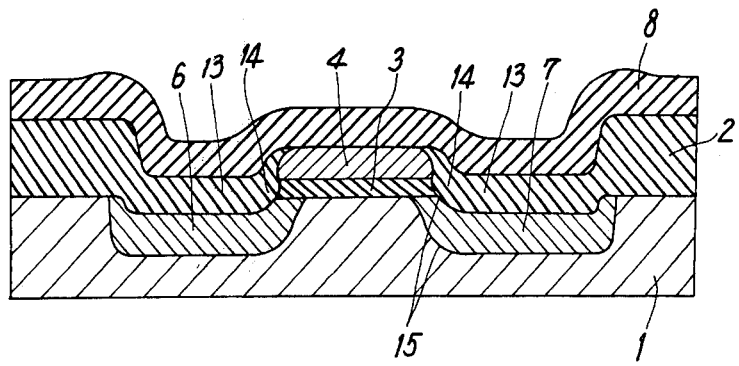

The thin $SiO_2$ film on the $Si_2N_4$ film 10, formed in the abovementioned heat treatment, is then removed by a mixed solution of ammonium fluoride and fluoric acid, subsequently the antioxidation film $Si_3N_4$ 10 is removed by hot phosphoric acid and the wafer is washed with deionized water and dried. Then, in order to give the necessary parts of the polycrystalline film 4 a desired conductivity, an impurity is selectively vapor-deposited on the necessary parts by a known photochemical method, and subsequently any surplus impurity is etched away, the wafer is washed by deionized water and then dried. Then an insulation film 8, for instance $SiO_2$ film, is grown as shown by FIG. 3(c) with known chemical vapor deposition means over the entire surface of the principal surface by a known method, for instance by thermal decomposition of monosilane, and a heat treatment is applied to the wafer. As a result of the heat treatment, the impurity is diffused into the polycrystalline silicon film 4, thereby giving it a sufficient conductivity so as to function as a gate electrode and as interconnecting conductors. The wafer obtained in the abovementioned way is then treated by known steps including vapor depositing interconnecting metal film (not shown) on the CVD film 8, to form a self-alignment MOS device.

As is described in the abovementioned method of the present invention, the side-end parts of the gate conductor film 4 are made round by the thermal oxidation process of the end parts, and the side-end parts are covered by the thermally oxidized dense insulation film 14, and therefore the gate breakdown voltage characteristic of the device is improved. Moreover, as shown in FIG. 3(c), by the abovementioned method, the surface of the gate conductor film 4 and the surfaces of parts of the thermally oxidized $SiO_2$ film 13, which parts are on the source region 6 and the drain region 7 and are adjacent to the gate conductor film 4, can be formed with very little level difference from each other, and the surfaces of the interposed boundary parts become considerably smooth in comparison with the steep step formed by the conventional method. Therefore, the metal films later formed (not shown) on the CVD film 8 are quite stable and the possibility of an open circuit of the metal film at step parts is eliminated resulting in a high yield in manufacture.

Figure 5:
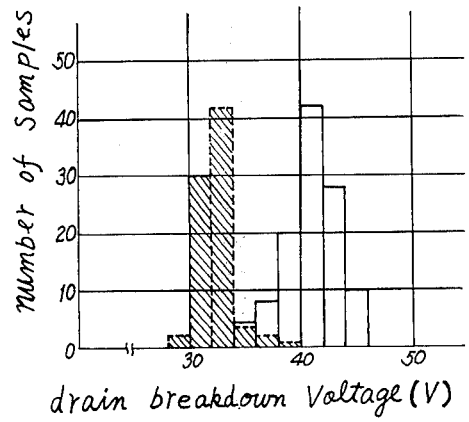
FIG. 5 is a graph showing the difference of drain reverse breakdown voltage of the MOS devices of FIG. 3 and of FIG. 1.

FIG. 5 is a graph showing difference of drain breakdown voltages of the MOS FETs made by the steps of FIG. 3(a) to (c) of the present invention and those of conventional MOS FETs. The MOS FETs tested for the comparison in FIG. 5 are as follows:

substrate . . . phosphor-doped N type single crystal of (111) axis with specific resistivities of 4-7Ωcm, source and drain regions . . . 1.0 - 1.3μm deep boron diffused regions, having surface impurity concentration of $1 \times 10^{19} - 1 \times 10^{20}$ atoms/cm$^3$, channel . . . width 188μm, length 8μm, enhancement type P-channel.

Figure 1:
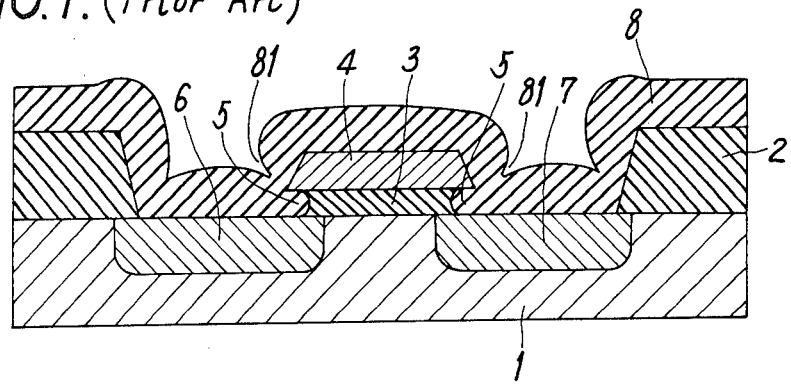
FIG. 1 is a sectional side view of a conventional MOS device.
Figure 2:
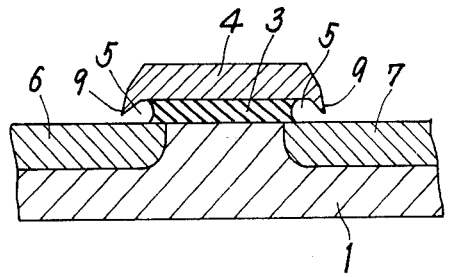
FIG. 2 is a sectional side view of one step of making a conventional MOS device, (a) to (c) of FIG. 3 are sectional side views of various steps of making MOS devices according to the present invention.
Figure 4:
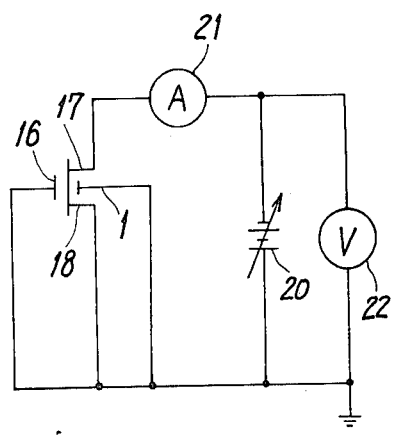
FIG. 4 shows a circuit diagram for measuring characteristic of the MOS device of FIG. 3.

The MOS FETs are tested in a circuit as shown by FIG. 4, wherein the gate electrode 16, source electrode 18 and the substrate 1 are connected to the positive end of the variable voltage source 20, the drain electrode 17 is connected through an ammeter 21 to the negative end of the variable voltage source 20, and a voltmeter 22 is connected across both ends of the variable voltage source 20.

In FIG. 5, hatched bars with dotted outlines indicate distributions of the drain breakdown voltage of MOS FETs made by conventional method and white bars with solid outlines indicate those of the MOS FETs made by the method of present invention. As shown in the graph, improvement of the drain breakdown voltage of the MOS device of the present invention against those of the conventional art is by about 10 volts.

The present invention is also applicable to N-channel silicon gate self-alignment MOS devices which have source and drain regions doped with phosphorus decomposed from $PH_3$ so as to have surface concentration of $1 \times 10^{19} - 1 \times 10^{20}$ atom/cm$^3$, and has the same effect as described in the above.

Another example of the present invention is to insert an additional step after the excessive etching of the gate insulation film 3 of FIG. 3(a) and before the forming of the thermally oxidized film 13 of FIG. 3(b). The additional step is selectively etching away the side end protrusions of the polycrystalline silicon film 4 and a apart of the uppermost part of the polycrystalline film 4 of FIG. 3(a) by means of a known etchant, which is capable of selectively etching the polycrystalline film 4 only and consists of a mixture of nitric acid, fluoric acid and water.

Another example is that the gate conductor film 4 is made of a layer or layers of a high temperature-resistive metal, for instance titanium, zirconium, niobium, tantalum, chromium, molybdenum, tungsten, paradium or platinum, or an alloy or alloys of these metals, which does not melt away or is not oxidized in the high-temperature treatment for the impurity diffusion, serves as the diffusion mask and functions as gate electrode and interconnection wires.

Another example is that the abovementioned antioxidation film 10 is an aluminum oxide (alumina) film.

As is described above, in the method of making the self-alignment type MOS device or MOS IC of the present invention, the thermal oxidation step of FIG. 3(b) is used to form the dense $SiO_2$ film 13 after covering the upper face of the conductor film 4, for instance polycrystalline silicon film, by the anti-oxidation film 10, for instance $Si_3N_4$ or alumina film. Accordingly, the concave shaped side end parts 41, 41 of the conductor film 4, which are formed by the side-etching of the gate insulation film 3, are made round and smooth continuous to the side end parts of the underlying gate insulation film 3. Moreover, the continuous surfaces of the side-end parts of the conductor film 4 and the gate insulation film 3 are covered by dense SiO$_2$ films, which serve to prevent contamination of the gate insulation film and assure stable performance without deterioration of the breakdown voltages and eliminating an open-circuit of the vapor deposited metal films (not shown) at the undesirable steps on the CVD film on the device.

What is claimed is:

1. A method of making a metal-oxide semiconductor device, said method including the following steps:
    A. sequentially forming on a predetermined part of single crystal silicon substrate, (1) a silicon oxide film; (2) a polycrystalline film which, under processing conditions forms a conductor film, having a specified pattern, and serving as a diffusion mask thereafter as a gate electrode; and
    B. diffusing an impurity into said substrate of step A from openings which are the parts other than those covered by said polycrystalline silicon film and said antioxidation film, said process characterized in that there is included the steps of
        (i) forming an antioxidation film for preventing oxidation of said polycrystalline silicon film such that the antioxidation film has the same pattern as said polycrystalline silicon film, and the subsequent step of
        (ii) thermally oxidizing side-end parts of the silicon oxide film underneath said polycrystalline silicon film and also the specified parts of the surface of said silicon substrate.

2. A method of making a metal-oxide semiconductor device, said method including the following successive steps of:
    A. sequentially forming on a predetermined part of single crystal silicon substrate;
        (1) an oxide film;
        (2) a metal film or a film capable of being conductor film of the high-temperature resistive nature, which metal film is not meltable at an impurity-diffusion temperature, serving as a diffusion mask and thereafter acting as a gate electrode; and
        (3) an oxidation-preventing film for preventing oxidation of said metal film or said film to become the conductor film (2), wherein at least said metal film and said overriding oxidation-preventing film (3) are of the same predetermined pattern so as to both cover and prevent oxidation of said metal film (2) by said oxidation-preventing film (3), and thereafter;
    B. thermally diffusing an impurity into the substrate of step A from openings which are the parts other than those covered by said metal film (2) and said oxidation preventing film (3), and simultaneously oxidizing
        (i) side-end sections of the oxide film underneath said film, and also
        (ii) the surface of said silicon substrate by a thermal oxidation caused by heat treatment in said thermal diffusion.

3. A method of claim 2 wherein said metal film or a film to become a conductor film is a film selected from the group consisting of polycrystalline silicon, titanium, zirconium, niobium, tantalum, chromium, molybdenum, tungsten and palladium.

4. A method of claim 2 wherein said oxidation preventing film is selected from the group consisting of silicon nitride (Si$_3$N$_4$) and alumina (Al$_2$O$_3$).

5. A method of making a metal-oxide semiconductor device, said method including the following successive steps of:
    A. sequentially forming on a predetermined portion of single crystal silicon substrate,
        (1) a silicon oxide film;
        (2) a polycrystalline silicon film which under processing becomes a conductor film, serving as a diffusion mask and later as a gate electrode; and
        (3) an antioxidation film preventing oxidation of said polycrystalline silicon film, wherein at least said polycrystalline silicon film and said overriding antioxidation film have the same pattern so as to both cover and prevent oxidation of said polycrystalline silicon film, and thereafter
    B. diffusing an impurity into the substrate of step A from openings which are the portions other than those covered by said polycrystalline silicon film and said antioxidation film, and simultaneously, thermally oxidizing side-end sections of the silicon oxide film underneath said polycrystalline silicon film and also the specified parts of surface of said silicon substrate.

6. A method of claim 5 wherein said antioxidation film is selected from the group consisting of silicon nitride (Si$_3$N$_4$) and alumina (Al$_2$O$_3$).

7. A method of claim 5 wherein the pattern of said antioxidation film is made by a photoetching process utilizing a photoresist mask and the pattern of said polycrystalline silicon film is made by selective etching utilizing etched a pattern of said antioxidation film as a mask.

8. A method of claim 5 wherein said oxide film is selectively etched to form openings for impurity diffusing by utilizing said antioxidation film and said polycrystalline silicon film as a mask.

9. A method of claim 5 wherein the thermal diffusion of said impurity for making regions of opposite conductivity type to that of said substrate is made in a wet oxygen atmosphere at a temperature of about 1000° – 1100° C.

* * * * *